(12) United States Patent
Reyes et al.

(10) Patent No.: US 7,223,984 B2
(45) Date of Patent: May 29, 2007

(54) HELIUM ION GENERATION METHOD AND APPARATUS

(75) Inventors: Jaime M. Reyes, Beverly, MA (US); Charles Prillaman, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 10/115,466

(22) Filed: Apr. 3, 2002

(65) Prior Publication Data

US 2003/0038246 A1    Feb. 27, 2003

Related U.S. Application Data

(60) Provisional application No. 60/281,070, filed on Apr. 3, 2001, provisional application No. 60/281,069, filed on Apr. 3, 2001.

(51) Int. Cl.
*H01J 27/08* (2006.01)

(52) U.S. Cl. .................. 250/426; 250/423 R; 250/424; 315/111.81

(58) Field of Classification Search ............... 250/426, 250/423 R, 424, 427, 423 F; 315/111.81, 315/111.91
See application file for complete search history.

(56) References Cited

U.S. PATENT DOCUMENTS

| 4,361,762 | A | 11/1982 | Douglas |
| 4,463,255 | A | 7/1984 | Robertson et al. |
| 4,595,837 | A | 6/1986 | Wu et al. |
| 4,691,109 | A | 9/1987 | Magee et al. |
| 4,697,085 | A * | 9/1987 | Magee et al. ................ 250/426 |
| 5,262,652 | A | 11/1993 | Bright et al. |
| 5,517,084 | A | 5/1996 | Leung |
| 5,943,594 | A | 8/1999 | Bailey et al. |
| 6,001,172 | A * | 12/1999 | Bhandari et al. ............. 117/84 |
| 6,060,715 | A | 5/2000 | England et al. |
| 6,356,026 | B1 | 3/2002 | Murto |
| 6,624,584 | B2 * | 9/2003 | Schmidt-Boecking et al. ..................... 315/111.81 |

FOREIGN PATENT DOCUMENTS

| JP | 10027553 | 1/1998 |
| JP | 11067114 | 3/1999 |
| JP | 2000208091 | 7/2000 |

OTHER PUBLICATIONS

Kretly, L.C., et al., "Efficient Medium Current He+Extraction Sustained by Auxiliary Plasma Formation in the Ion Source by Solid Material." Ion Implantation Technology. Proceedings of the 11th International Conference, Austin, TX, USA 16-21, Jun. 1996, New York, NY, IEEE, US, Jun. 16, 1996, pp. 422-423, XP010220700. ISBN: 0-7803-3289-X.

* cited by examiner

Primary Examiner—Jay M. Patidar

(57) ABSTRACT

The invention provides methods and apparatus for generating helium ions. The methods involve providing a mixture of helium gas with a second gas in an ion source. The second gas has a lower ionization potential and larger molecules than that of helium. The helium gas is ionized by generating an arc discharge within the ion source. The presence of the second gas enhances the ionization of the helium gas. The increased helium ionization enables formation of helium ion beams having a high beam currents suitable for implantation.

31 Claims, 2 Drawing Sheets

HELIUM ION GENERATION METHOD AND APPARATUS

CROSS REFERENCE TO RELATED APPLICATIONS

This application claims priority to U.S. provisional patent application Ser. No. 60/281,070, filed Apr. 3, 2001, entitled "Method to Enhance Helium Ion Production In An Ion Source Apparatus", and U.S. provisional patent application Ser. No. 60/281,069, filed Apr. 3, 2001, entitled "Multi-Charge Filament", the disclosures of which are incorporated herein by reference in their entirety.

FIELD OF THE INVENTION

The invention relates generally to ion implantation and, more particularly, to a method and apparatus for generating helium ions.

BACKGROUND OF THE INVENTION

Ion implantation is a conventional technique for introducing dopants into semiconductor materials. A desired dopant may be ionized to form a plasma in an ion source. The ions are accelerated from the source to form an ion beam of selected energy which may be directed at the surface of a semiconductor wafer. The ions in the beam penetrate into the semiconductor wafer to form an implanted region.

In some processes, it is desirable to implant helium in a semiconductor wafer. One conventional technique involves introducing pure helium gas into an arc chamber of an ion source. Current is passed through a filament located in the arc chamber, and a voltage is applied to generate a plasma that includes helium ions within the chamber. However, because helium has a high ionization potential and a small molecular size, the generation of helium ions is typically inefficient. Thus, helium ion beams that are formed utilizing such techniques typically have relatively low beam currents which may be unsuitable for use in some implantation processes.

SUMMARY OF THE INVENTION

The invention provides methods and apparatus for generating helium ions which may be used to form an ion beam in an ion implantation system.

In one aspect, the invention provides a method of generating helium ions. The method comprises providing a mixture of helium gas and a second gas in an arc chamber of an ion source. The second gas comprises an element having a lower ionization potential than helium. The method further comprises ionizing helium gas in the mixture to generate helium ions.

In another aspect, the invention provides a method of generating helium ions. The method comprises providing a mixture of helium gas and a second gas in an arc chamber of an ion source. The second gas comprises an element having a lower ionization potential than helium. The mixture comprises between about 0.1% and about 10%, by volume, of the second gas. The method further comprises ionizing helium gas in the mixture to generate helium ions, extracting helium ions from the ion source to form an ion beam, and implanting the helium ions in the ion beam into a semiconductor wafer.

In another aspect, the invention provides an ion source. The ion source comprises an arc chamber and at least one gas source connected to the arc chamber. The at least one gas source provides helium and a second gas to the arc chamber, wherein the second gas comprises an element having a lower ionization potential than helium.

Other aspects, features and advantages will become apparent from the following detailed description and drawings when considered in conjunction with the claims.

DETAILED DESCRIPTION

The invention provides methods and apparatus for generating helium ions. The methods involve providing a mixture of helium gas with a second gas in an ion source. The second gas comprises an element that has a lower ionization potential and larger molecules than that of helium. The helium gas is ionized by generating an arc discharge within the ion source. As described further below, the presence of the second gas enhances the ionization of the helium gas. The increased helium ionization enables formation of helium ion beams having relatively high beam currents suitable for implantation.

Figure 1:
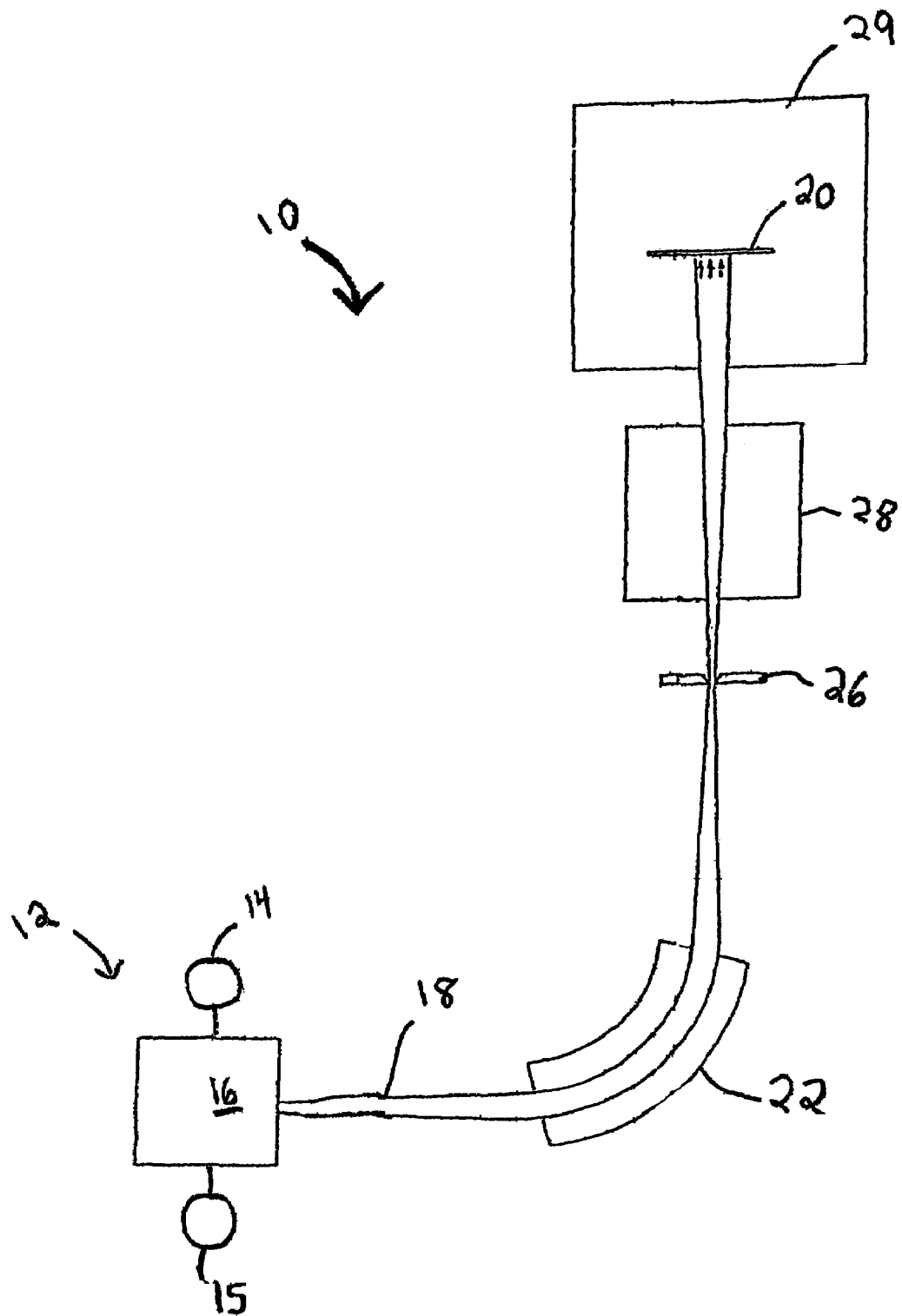
FIG. 1 schematically illustrates an ion implantation system that may be used in connection with embodiments of the present invention.

A schematic block diagram of a typical ion implantation system 10 is shown in FIG. 1. An ion source 12 of the system includes a helium gas supply 14 and a second gas supply 15 connected to an arc chamber 16. As described further below, gases from supplies 14, 15 are introduced into arc chamber 16 and helium ions are generated. The helium ions may be extracted from the ion source to form an ion beam 18 which is directed along a beam path toward a target such as a semiconductor wafer 20.

Ion beam 18 is deflected and focused by a mass analyzing magnet 22. Downstream of the mass analyzing magnet 22, the ion beam may be focused in the plane of a mass resolving slit assembly 26. The ion beam 18 is accelerated to a desired energy by an accelerator 28 and impinges on wafer 20 located within an end station 29. The entire region between ion source 12 and wafer 20 is evacuated during ion implantation.

The ion beam 18 may be distributed over the surface of wafer 20 by mechanically scanning the wafer with respect to the beam, by scanning the ion beam with respect to the wafer or by a combination of these techniques. The wafers may be, for example, mounted on a rotating disk during ion implantation. End station 29 may include a system for automatically loading semiconductor wafers into one or more wafer positions for implantation and for removing the wafers from the wafer positions after ion implantation. The ion implantation system may include other components, not shown but known to the skilled person in the art, such as a dose measuring system, an electron flood system, and a tilt angle monitoring system, among others. It should also be understood that the system may includes a single gas supply that introduces a mixture of helium and the second gas into the arc chamber.

Figure 2:
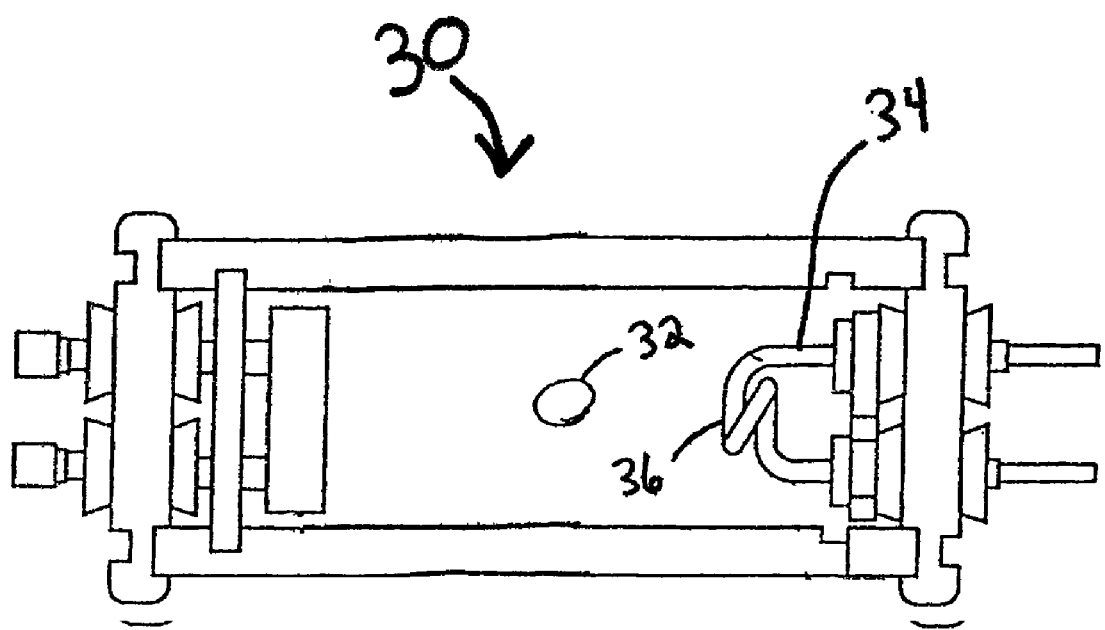
FIG. 2 schematically illustrates an arc chamber of an ion source according to one embodiment of the present invention.

FIG. 2 shows an arc chamber 30 of ion source 12 (FIG. 1) according to one embodiment of the present invention. Arc chamber 30 may have any suitable design known in the art including a Bernas source plasma generator. In the illustrative embodiment, the mixture of helium gas and the second gas are fed into the chamber through a single inlet 32. It should be understood that in other embodiments of the invention, separate inlets are provided for separate introduction of helium and the second gas.

During operation, chamber 30 is maintained under a vacuum (e.g., between about 1 and 10 torr). Current is passed through a filament 34 causing an active region 36 of filament 34 to heat up and thermionically emit electrons from its surface. Filament 34 may be any type of hot filament known in the art and may be, for example, made of tungsten or tantalum. In some embodiments, a filament may be used which has a relatively small surface area from which electrons are emitted (i.e., active portion) as described in commonly-owned, co-pending U.S. patent application Ser. No. not yet assigned, filed Apr. 3, 2002, entitled "Ion Source Filament and Method", the disclosure of which is incorporated herein by reference in its entirety.

A voltage, for example between about 30 and about 150 volts, may be applied between the filament 34 and a positive electrode (e.g., chamber wall). The electrons emitted from the filament collide with helium and the second gas molecules in the chamber. In some embodiments, a magnetic field may be applied perpendicular to the electric field within the chamber to increase the electron path and, thus, increase the probability of collisions between electrons and gas molecules within the chamber. The collisions generate a plasma of ionic species which includes $He^+$ and $He^{++}$ ions. As described above, the helium ions may be extracted from the source to form an ion beam. The helium ions may be isolated from other ions which also may be extracted from the source and then implanted, for example, into a semiconductor wafer.

It is believed that the presence of the second gas increases the number of collisions that have sufficient energy to ionize the helium molecules. The increased number of collisions results, at least in part, from the second gas molecules being larger in size than helium gas molecules. As a result of the increased collisions, the formation of helium ions is increased as compared to methods that introduce only a helium gas into the arc chamber. The second gas comprises an element having an ionization potential lower than that of helium and, thus, it should be understood that the plasma generated in the chamber also generally includes ionic species of the second gas.

Suitable second gases include any gas that comprise an element having an ionization potential lower than that of helium. The gas may be an element (e.g., Ar) or a compound that comprises at least one element having an ionization potential lower than that of helium (e.g., $AsH_3$). It should be understood that the term "ionization potential", as used herein, refers to the first ionization potential of He which is about 24.481 eV. The second gas also has a higher atomic number than helium and a larger molecular size than helium. Suitable second gases include $AsH_3$, $BF_3$, $PH_3$, Ar, $N_2$, $SiF_4$, $GeF_4$, $GeCl_4$, $B_2H_6$, $BCl_3$, Xe, Br, $CO_2$, CO, HCl, $H_2S$, Kr, Ne, $O_2$, $PCl_3$, $PF_3$, $PH_3$, $Si_2H_4$, $Si_2H_6$, $SO_2$, InCl, $InCl_3$, $As_2O_3$, $SbF_3$, Cs, $BeCl_2$, $BeBr_2$, $BeI_2$, $AlCl_3$, $AlBr_3$, $AlI_3$, $SbCl_3$, $SbBr_3$, $SbI_3$, $Sb_2O_3$, $BiCl_3$, $BiBr_3$, $GaCl_3$, Hg, $P_2O_5$, and Se. In some embodiments, Ar, Ne, or $N_2$ are preferred second gases. In some cases, the second gas comprises an element from any one of Groups III, IV, V, VI, VII, and VIII. Generally, the second gas is provided as a single gaseous component. However, it is also possible that the second gas, itself, can be a mixture of gases.

The second gas is present in the arc chamber in any amount sufficient to achieve the desired helium ionization efficiency. In some embodiments, the mixture comprises between about 0.1% and about 95%, by volume, of the second gas. In some embodiments, it may be preferable for the volume percentage of helium to be greater than the volume percentage of the second gas. For example, the mixture may comprise between about 0.1% and about 10%, or between about 1% and about 10% of the second gas, by volume. Flow rates of the helium and the second gas may be adjusted to provide the desired volume percentages.

In some embodiments, a mixture of 5% Ar/95% He (by volume) may be preferred. With a 5% Ar/95% He mixture, a $He^{++}$ beam current of about 23 µA has been generated using an arc voltage of 145 Volts (V) and an arc current of 4 Amperes (A) in a VSEA model EHP ion implanter (Varian Semiconductor Equipment Associates, Inc., Gloucester, Mass.).

In other embodiments, a mixture of 2% Ne/98% He may be preferred. In other embodiments, a mixture of 5% Ne/95% He may be preferred. In other embodiments, a mixture of 3% $N_2$/97% He may be preferred.

In embodiments that utilize a single inlet (32, FIG. 2), the second gas may be pre-mixed with helium and then introduced into the chamber. When separate inlets are utilized, the second gas and the helium gas may be introduced into the chamber separately and mixed therein. Separate inlets may be preferred, for example, when a vaporizer source is used to supply the second gas. Vaporizer sources may be utilized when the second gas has a very low ambient partial pressure, such as for solid material sources (e.g., phosphorous and arsenic). The vaporizer is typically operated at temperatures between about 100° C. and about 500° C. depending on the compound selected.

In one embodiment, helium gas is introduced into an arc chamber at a pressure of between about 1 and 10 Torr (e.g., 8 Torr) and a phosphorus vaporizer at temperatures of 300 to 400° C. (e.g., 350° C.) is used to introduce phosphorous into the arc chamber. Under these conditions, for example, beam currents of 4 mA $He^+$ and 15 µA $He^{++}$ have been generated using an arc voltage of 145 V and an arc current of 4A in a VSEA model EHP ion implanter (Varian Semiconductor Equipment Associates, Inc., Gloucester, Mass.).

In another embodiment, helium gas is introduced into arc chamber at a pressure of between about 1 and 10 Torr (e.g., 8 Torr) and a phosphorus vaporizer at temperatures of 300 to 400° C. (e.g., 350° C.) is used to introduce phosphorous into the arc chamber.

The above description is intended to be illustrative and not exhaustive. The description will suggest many variations and alternatives to one of ordinary skill in this art. All these alternatives and variations are intended to be included within the scope of the attached claims. Those familiar with the art may recognize other equivalents to be specific embodiments described herein which equivalents are also intended to be encompassed by the claims attached hereto. Further, the particular features presented in the independent claims below can be combined with each other in other manners within the scope of the invention such that the invention should be recognized as also specifically directed to other embodiments having any other possible combination of the features of the dependent claims.

What is claimed is:

1. A method of implanting helium ions into a semiconductor wafer comprising:
   providing a mixture of helium gas and a second gas in an arc chamber of an ion source, the second gas comprising an element having a lower ionization potential than helium;

adjusting flow rates of the helium gas and the second gas to provide the mixture having desired volume percentages so that a desired helium ionization efficiency is achieved;

ionizing helium gas in the mixture to generate helium ions; and implanting the helium ions into the semiconductor wafer.

2. The method of claim 1, wherein the second gas is selected from the group consisting of $AsH_3$, $BF_3$, $PH_3$, Ar, $N_2$, $SiF_4$, $GeF_4$, $GeCl_4$, $B_2H_6$, $BCl_3$, Xe, Br, $CO_2$, CO, HCl, $H_2S$, Kr, Ne, $O_2$, $PCl_3$, $PF_3$, $PH_3$, $Si_2H_4$, $Si_2H_6$, $SO_2$, InCl, $InCl_3$, $As_2O_3$, $SbF_3$, Cs, $BeCl_2$, $BeBr_2$, $BeI_2$, $AlCl_3$, $AlBr_3$, $AlI_3$, $SbCl_3$, $SbBr_3$, $SbI_3$, $Sb_2O_3$, $BiCl_3$, $BiBr_3$, $GaCl_3$, Hg, $P_2O_5$, Se, and mixtures thereof.

3. The method of claim 2, wherein the second gas is selected from the group consisting of Ar, Ne, and $N_2$.

4. The method of claim 1, wherein the second gas comprises an element from any one of Groups III, IV, V, VI, VII, and VIII.

5. The method of claim 1, wherein the mixture comprises between about 0.1% and about 95%, by volume, of the second gas.

6. The method of claim 1, wherein the mixture comprises between about 0.1% and about 10%, by volume, of the second gas.

7. The method of claim 1, wherein the mixture comprises between about 1% and about 10%, by volume, of the second gas.

8. The method of claim 1, wherein the second gas is Ar and the mixture comprises about 5%, by volume, of Ar.

9. The method of claim 1, wherein the pressure of the mixture in the arc chamber is maintained between about 1 torr and about 10 torr.

10. The method of claim 1, wherein the second gas is provided to the arc chamber from a vaporizer.

11. The method of claim 1, comprising igniting an arc discharge in the mixture to ionize the helium gas.

12. The method of claim 11, wherein the arc discharge is generated at an arc voltage of about 145 V and an arc current of about 4 A.

13. The method of claim 1, further comprising generating a plasma comprising helium ions within the arc chamber.

14. The method of claim 1, further comprising extracting helium ions from the ion source to form an ion beam.

15. The method of claim 14, further comprising isolating helium ions in the ion beam to form a helium ion beam.

16. The method of claim 15, further comprising implanting the helium ions in the helium ion beam in to the semiconductor wafer.

17. The method of claim 1, further comprising ionizing the second gas.

18. The method of claim 1, wherein the helium ions include $He^+$ ions.

19. The method of claim 1, wherein the helium ions include $He^{++}$ ions.

20. The method of claim 1, wherein the second gas comprises an element having a lower ionization potential than 24.481 eV.

21. The method of claim 1, wherein molecules of the second gas are larger than helium gas molecules.

22. A method of implanting helium ions into a semiconductor wafer comprising:

providing a mixture of helium gas and a second gas in an arc chamber of an ion source, the second gas comprising an element having a lower ionization potential than helium, adjusting flow rates of the helium gas and the second gas to provide the mixture comprising between about 0.1% and about 10%, by volume, of the second gas so that a desired helium ionization efficiency is achieved;

ionizing helium gas in the mixture to generate helium ions;

extracting helium ions from the ion source to form an ion beam; and implanting the helium ions in the ion beam in to the semiconductor wafer.

23. An ion source for implanting helium ions into a semiconductor wafer comprising:

an arc chamber; and at least one gas source connected to the arc chamber, the at least one gas source providing helium and a second gas to the arc chamber and flow rates of the helium and the second gas being adjusted to provide a mixture having predetermined volume percentages so that a desired helium ionization efficiency is achieved, wherein the second gas comprises an element having a lower ionization potential than helium and the helium gas is ionized to generate helium ions which are implanted into the semiconductor wafer.

24. The ion source of claim 23, wherein the at least one gas source includes a helium gas supply and a second gas supply separate from the helium gas supply.

25. The ion source of claim 24, wherein the helium gas source is connected to a first inlet of the arc chamber and the second gas source is connected to a second inlet of the arc chamber.

26. The ion source of claim 23, wherein the second gas is selected from the group consisting of $AsH_3$, $BF_3$, $PH_3$, Ar, $N_2$, $SiF_4$, $GeF_4$, $GeCl_4$, $B_2H_6$, $BCl_3$, Xe, Br, $CO_2$, CO, HCl, $H_2S$, Kr, Ne, $O_2$, $PCl_3$, $PF_3$, $PH_3$, $Si_2H_4$, $Si_2H_6$, $SO_2$, InCl, $InCl_3$, $As_2O_3$, $SbF_3$, Cs, $BeCl_2$, $BeBr_2$, $BeI_2$, $AlCl_3$, $AlBr_3$, $AlI_3$, $SbCl_3$, $SbBr_3$, $SbI_3$, $Sb_2O_3$, $BiCl_3$, $BiBr_3$, $GaCl_3$, Hg, $P_2O_5$, Se, and mixtures thereof.

27. The ion source of claim 23, wherein the second gas is selected from the group consisting of Ar, Ne, and $N_2$.

28. The ion source of claim 23, wherein the second gas source is a vaporizer.

29. The ion source of claim 23, wherein molecules of the second gas are larger than helium gas molecules.

30. The ion source of claim 23, wherein the at least one gas source includes a single gas supply that provides the mixture of helium and the second gas to the arc chamber.

31. The ion source of claim 30, wherein the single gas supply is connected to a single inlet of the arc chamber.

* * * * *